United States Patent
Dai et al.

(10) Patent No.: US 9,323,095 B2
(45) Date of Patent: Apr. 26, 2016

(54) LENS WITH LIGHT-DIFFUSION CAPPING LAYERS AND BACKLIGHT MODULE INCORPORATING THE SAME

(71) Applicant: HON HAI PRECISION INDUSTRY CO., LTD., New Taipei (TW)

(72) Inventors: Feng-Yuen Dai, New Taipei (TW);
Chau-Jin Hu, New Taipei (TW);
Li-Ying Wang He, New Taipei (TW);
Yung-Lun Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 206 days.

(21) Appl. No.: 14/092,946

(22) Filed: Nov. 28, 2013

(65) Prior Publication Data
US 2015/0116984 A1    Apr. 30, 2015

(30) Foreign Application Priority Data
Oct. 28, 2013   (TW) .............................. 102138836 A

(51) Int. Cl.
*G02F 1/1335* (2006.01)
*H01L 33/58* (2010.01)
*G02B 19/00* (2006.01)

(52) U.S. Cl.
CPC .......... *G02F 1/1335* (2013.01); *G02B 19/0061* (2013.01); *G02F 1/133603* (2013.01); *H01L 33/58* (2013.01); *G02B 19/0009* (2013.01); *G02F 2001/133607* (2013.01)

(58) Field of Classification Search
CPC .............. G02F 1/1335; G02B 19/0061; G02B 19/0009
See application file for complete search history.

(56) References Cited

U.S. PATENT DOCUMENTS

| | | | | |
|---|---|---|---|---|
| 2007/0019416 A1* | 1/2007 | Han | ........................ | H01L 33/58 362/307 |
| 2007/0236937 A1* | 10/2007 | Chao | ....................... | F21V 5/046 362/327 |
| 2008/0013322 A1* | 1/2008 | Ohkawa | ............. | G02B 27/0955 362/311.06 |
| 2009/0272990 A1* | 11/2009 | Sun | ..................... | G02B 19/0028 257/89 |
| 2011/0140168 A1* | 6/2011 | Sim | ..................... | H01L 31/1075 257/186 |
| 2014/0146518 A1* | 5/2014 | Chen | ....................... | G06F 13/04 362/84 |
| 2014/0293614 A1* | 10/2014 | Wang | ........................ | F21V 5/04 362/311.02 |

FOREIGN PATENT DOCUMENTS

JP    WO 2011148674 A1 * 12/2011    ........ G02F 1/133603

* cited by examiner

*Primary Examiner* — Mary Ellen Bowman
(74) *Attorney, Agent, or Firm* — Novak Druce Connolly Bove + Quigg LLP

(57) ABSTRACT

A lens includes a main lens, a first light-diffusion capping layer and a second light-diffusion capping layer formed on the top of the main lens in sequence. The main lens includes a light incident surface and a light exit surface opposite to the light incident surface. The main lens defines a recess in the top thereof, and the recess is located at a central region of the light exit surface and recessed inwardly toward the light incident surface. The first and the second light-diffusion capping layers are received in the recess, and the second light-diffusion capping layer is located over the first light-diffusion capping layer. A refractive index of the first light-diffusion capping layer is smaller that that of the main lens but larger than that of the second light-diffusion capping layer. A backlight module source incorporating the lens and the LED light source is also provided.

20 Claims, 6 Drawing Sheets

LENS WITH LIGHT-DIFFUSION CAPPING LAYERS AND BACKLIGHT MODULE INCORPORATING THE SAME

TECHNICAL FIELD

The present disclosure relates generally to a lens with a plurality of light-diffusion capping layers formed on the top thereof and a backlight module incorporating the lens.

DESCRIPTION OF RELATED ART

LEDs are solid state light emitting devices formed of semiconductors. LEDs are more stable and reliable than other conventional light sources such as incandescent bulbs. Thus, LEDs are being widely used in various fields such as numeral/character displaying elements, signal lights, and lighting and display devices.

Nowadays, LED light sources are widely applied for illumination, such as being used in direct-type backlight module assembly. The direct-type backlight module assembly includes an LED light source and a lens optically coupled to the LED light source. Light generated from the LED light source is mostly spread by the lens into a wide angular range. However, a part of the light generated from the LED light source is likely to be restricted inside the lens due to total internal reflection occurring at the lens-air interface. That is, the lens and the backlight module using the lens have low light extraction efficiency. Furthermore, the lens is still likely to generate a 'hot spot' of fairly intense light in the center of the illumination field. That is, the backlight module using such lens still creates an unsatisfactorily non-uniform light distribution pattern.

What is needed therefore is a lens and a backlight module incorporating the lens which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
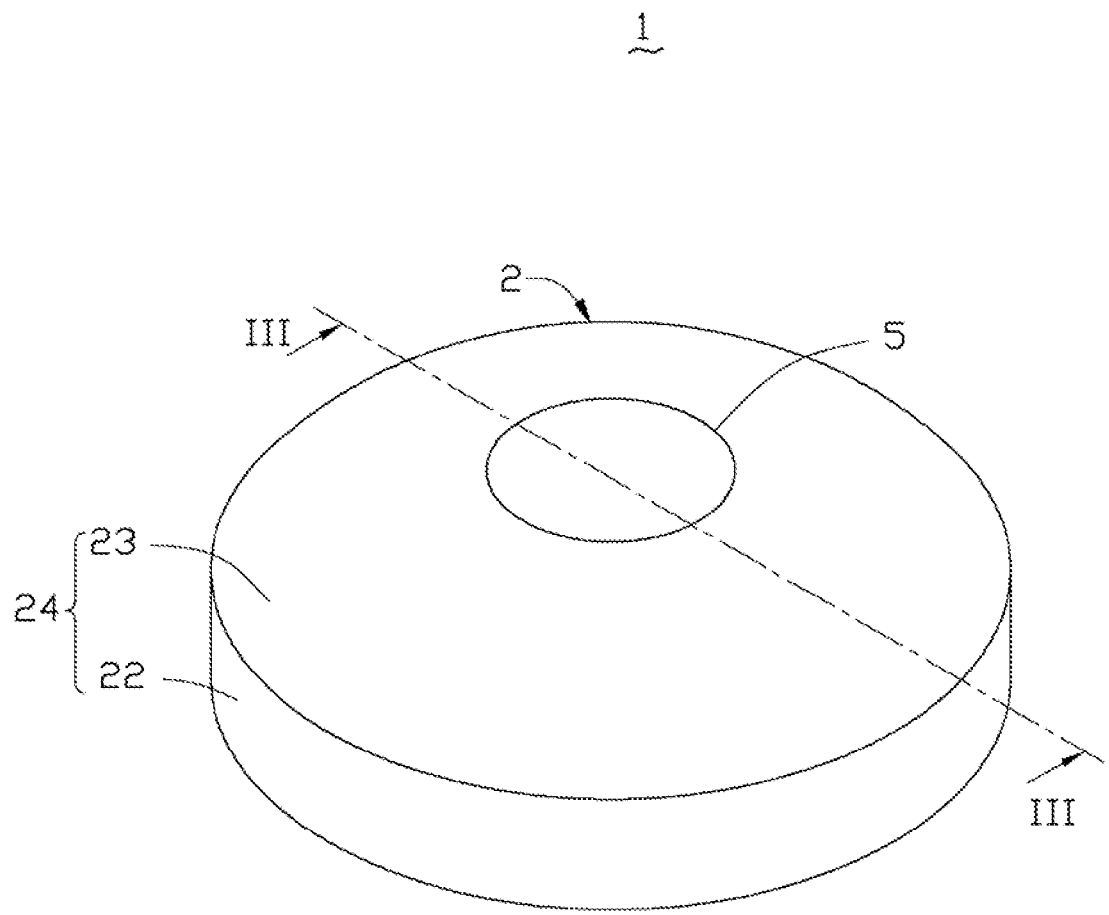
FIG. 1 is an isometric, perspective view of a backlight module in accordance with a first embodiment of the present disclosure.
Figure 2:
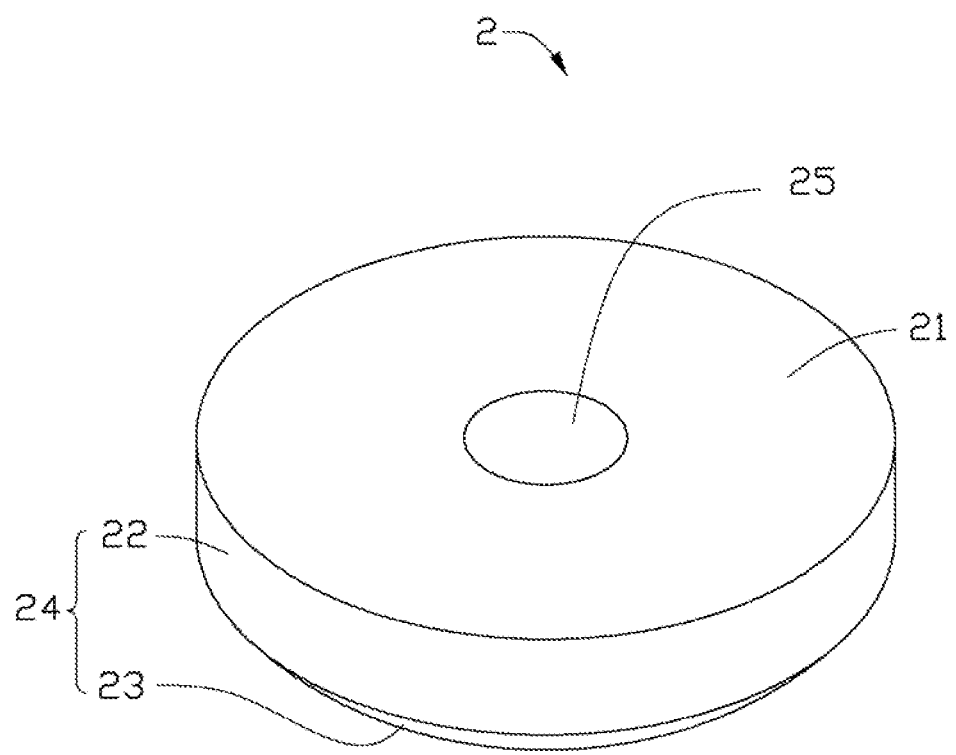
FIG. 2 is an inverted view of a lens of the backlight module of FIG. 1.
Figure 3:
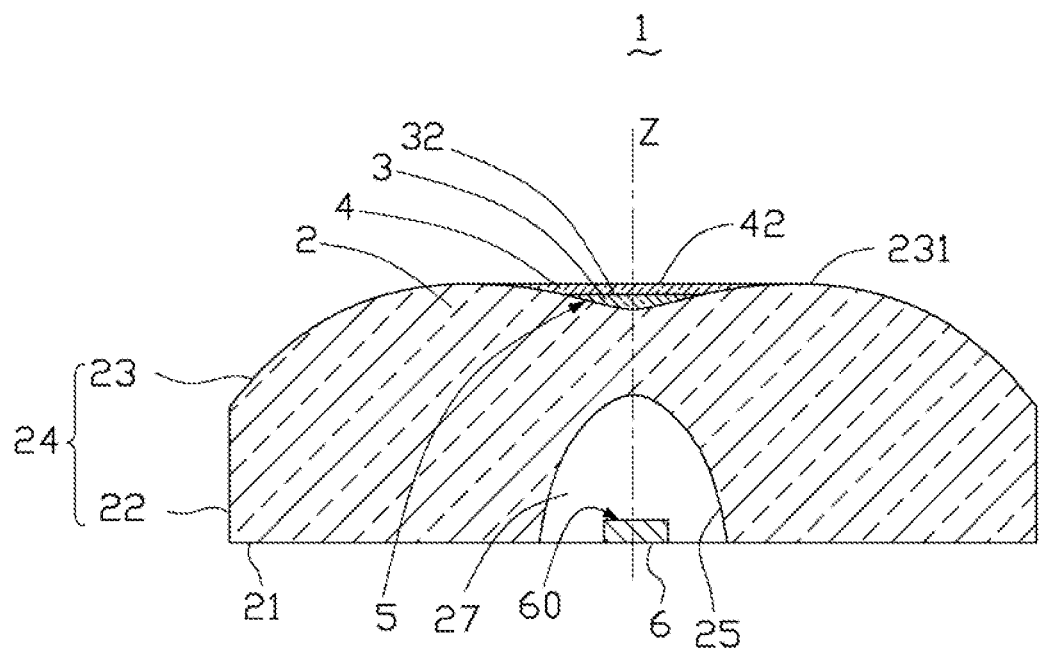
FIG. 3 is a cross-sectional view of the backlight module of FIG. 1, taken along a line III-III thereof.

Referring to FIGS. 1-3, a backlight module 1 in accordance with a first embodiment of the present disclosure is illustrated. The backlight module 1 includes a light emitting diode (LED) light source 6 and a lens optically coupled to the LED light source 6. The lens includes a main lens 2, a first light-diffusion capping layer 3 and a second light-diffusion capping layer 4 formed on the top of the main lens 2 in sequence. A refractive index of the first light-diffusion capping layer 3 is smaller that that of the main lens 2 but larger than that of the second light-diffusion capping layer 4.

The main lens 2 includes a light incident surface 25 and a light exit surface 24 opposite to the light incident surface 25. Light generated by the LED light source 6 is refracted into the main lens 2 through the light incident surface 25 and then refracted out the main lens 2 from the light exit surface 24. The main lens 2 has an optical axis Z extending through the light incident surface 25 and the light exit surface 24 thereof. The light incident surface 25 and the light exit surface 24 each are radially symmetrical with respect to the optical axis Z of the main lens 2.

The main lens 2 further includes an annular mounting surface 21 that interconnects the light incident surface 25 and the light exit surface 24. The light incident surface 25 is located at a center of the mounting surface 21 and recessed inwardly towards the light exit surface 24 from an inner periphery of the annular mounting surface 21. In the present embodiment, the light incident surface 25 is a part of an ellipsoid. Alternatively, the light incident surface 25 is a part of a sphere or a paraboloid.

The light exit surface 24 includes a first cylindrical portion 22 extending upwardly from an outer periphery of the annular mounting surface 21 and a second convex portion 23 bending inwardly and upwardly from a top periphery of the first cylindrical portion 22. A distance between a bottom of the main lens 2 and the second convex portion 23 of the light exit surface 24 increases firstly and then decreases along a radial direction perpendicular to the optical axis Z of the main lens 2 from a center to a periphery of the main lens 2.

The light incident surface 25 and the mounting surface 21 cooperatively define a receiving space 27. The LED light source 6 is received in the receiving space 27 and located at the optical axis Z of the main lens 2. A light-emitting face 60 of the LED light source 6 faces the light incident surface 25 of the main lens 2. The light refracted into the main lens 2 is mostly refracted out the main lens 2 from the second convex portion 23 of the light exit surface 24, with a part of light being refracted out the main lens 2 from the first cylindrical portion 22 of the light exit surface 24.

The main lens 2 defines a recess 5 on the top thereof. The recess 5 is located at a central region of the light exit surface 24 and recessed inwardly toward the light incident surface 25 of the main lens 2. The first and second light-diffusion capping layers 3, 4 are received in the recess 5. The first light-diffusion capping layer 3 directly contacts the bottom of the recess 5. The second light-diffusion capping layer 4 covers the first light-diffusion capping layer 3. In the present embodiment, the recess 5 is located at a central region 231 of the second convex portion 23 of the main lens 2.

The recess 5 is funnel-shaped with a larger opening thereof at the top end. A diameter of the recess 5 gradually increases along the optical axis Z from the light incident surface 25 to the second convex portion 23 of the light exit surface 24 of the main lens 2. The first light-diffusion capping layer 3 has a non-uniform thickness along a radial direction perpendicular to the optical axis Z of the main lens 2. In detail, the thickness of the first light-diffusion capping layer 3 is gradually decreased along the radial direction from the center to the periphery of the main lens 2.

The second light-diffusion capping layer 4 is formed on a top surface 32 of the first light-diffusion capping layer 3. The second light-diffusion capping layer 4 includes a top surface 42 and a bottom surface at opposite sides thereof. The bottom surface of the second light-diffusion capping layer 4 engages with the top surface 32 of the first light-diffusion capping layer 3. The top surface 42 of the second light-diffusion capping layer 4 is coplanar with the top of the central region 231 of the second convex portion 23 of the light exit surface 24 of the main lens 2, whereby the lens has a flat top surface. Alternatively, the top surface 42 of the second light-diffusion capping layer 4 can be lower than the top of the central portion 231 of the main lens 2, so as to leave a space in the recess 5 which can be filled by a sealing medium or another light-diffusion capping layer having a refractive index smaller than that of the first and second light-diffusion capping layers 3, 4 until the recess 5 is completely filled.

The main lens 2 is made of transparent or translucent material, such as polycarbonate (PC) resin, polystyrene (PS) resin or methyl methacrylate-styrene (MS) resin. The main lens 2 has a refractive index in a range of 1.57 to 1.59. The first and second light-diffusion capping layers 3, 4 each are made of a material selected from polymethyl-methacrylate (PMMA) resin or silicone resin. Each of the first and second light-diffusion capping layers 3, 4 has a refractive index in a range of 1.24 to 1.49. For example, the first light-diffusion capping layer 3 has a refractive index of 1.49 and the second light-diffusion capping layer 4 has a refractive index of 1.24.

A method of manufacturing the first light-diffusion capping layer 3 includes the following steps: filling the recess 5 of the main lens 2 with a first raw material having a first refractive index; flattening the top of the raw material via hot pressing to form a preformed material; and exposing the preformed material to an ultraviolet radiation so as to harden and solidify the preformed material to obtain the first light-diffusion capping layer 3. Similarly, the second light-diffusion capping layer 4 is manufactured by the method as described above.

Figure 4:
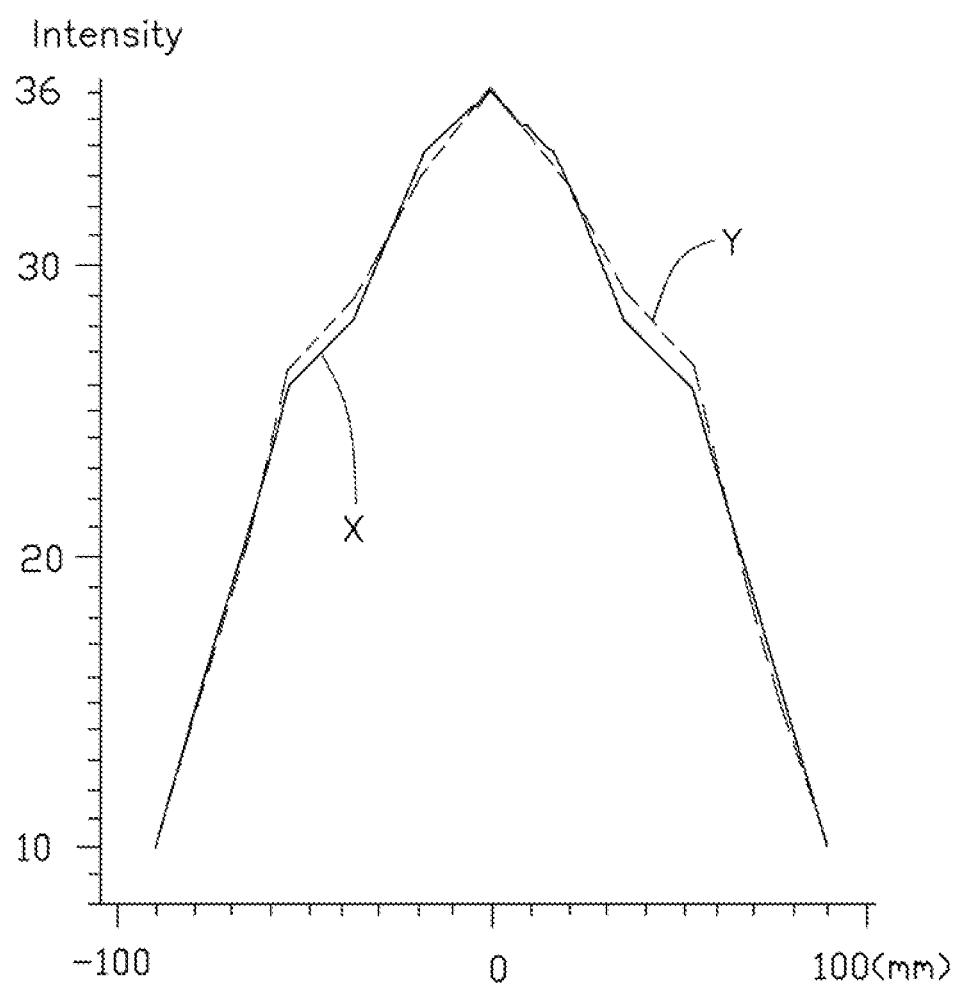
FIG. 4 is a light intensity distribution of a backlight module using a lens similar to the lens shown in FIG. 1, but without light-diffusion capping layers formed on the top of a main lens of the lens of the backlight module.

Referring to FIG. 4, a light intensity distribution pattern of a backlight module using a lens similar to that shown in FIG. 1 but without the first and second light-diffusion capping layers 3, 4 is illustrated. The abscissa in FIG. 4 represents a distance between a selected point and an optical axis (i.e., a center) of the LED light source 6 of the backlight module in a projected plane, i.e., a light diffusion plane (not shown) of the light filed of light generated by the LED light source and through the lens, while the ordinate represents light intensity (in arbitrary unit). The optical axis of the LED light source 6 is coincident with the optical axis Z of the lens. The solid curve X shown in FIG. 4 represents a light distribution pattern in a first direction of the projected plane, while the dashed curve Y represents another light distribution pattern in a second direction of the projected plane perpendicular to the first direction, wherein 0 millimeter means a point of the projected plane where the optical axis Z of the LED light source 6 of the backlight module extends through.

Different from the lens shown in FIG. 1, the lens of the backlight module in FIG. 4 only includes the main lens 2 but without the first and second light-diffusion capping layers 3, 4 formed on the top of the main lens 2. Light generated from the LED light source 6 is refracted into the lens through the light incident surface 25 thereof, and a part of the refracted light impinging on the light exit surface 24 with an incident angle larger than a critical angle for total internal reflection at the lens-air interface is reflected back into the lens due to total internal reflection. In the present disclosure, the refractive index of the lens is 1.57, and the critical angle for the total internal reflection at the lens-air interface is 39.57 degrees.

As described above, a part of the refracted light with an incident angle larger than 39.57 degrees is restricted in the lens due to the total internal reflection. The backlight module in FIG. 4 has a low light extraction efficiency. Furthermore, the refracted light with an angle smaller than 39.57 degrees is refracted out the lens from the light exit surface of the lens, thereby creating a sharp peak (i.e., a hot spot) in the center of the light field, together with a shoulder (i.e., an annular region around the center) around the sharp peak as shown in FIG. 4. That is, a light distribution of the backlight module in FIG. 4 is mostly concentrated at the center while becomes rapidly weaker towards a periphery of the lens. Thus, the backlight module in FIG. 4 creates a non-uniform light distribution.

Figure 5:
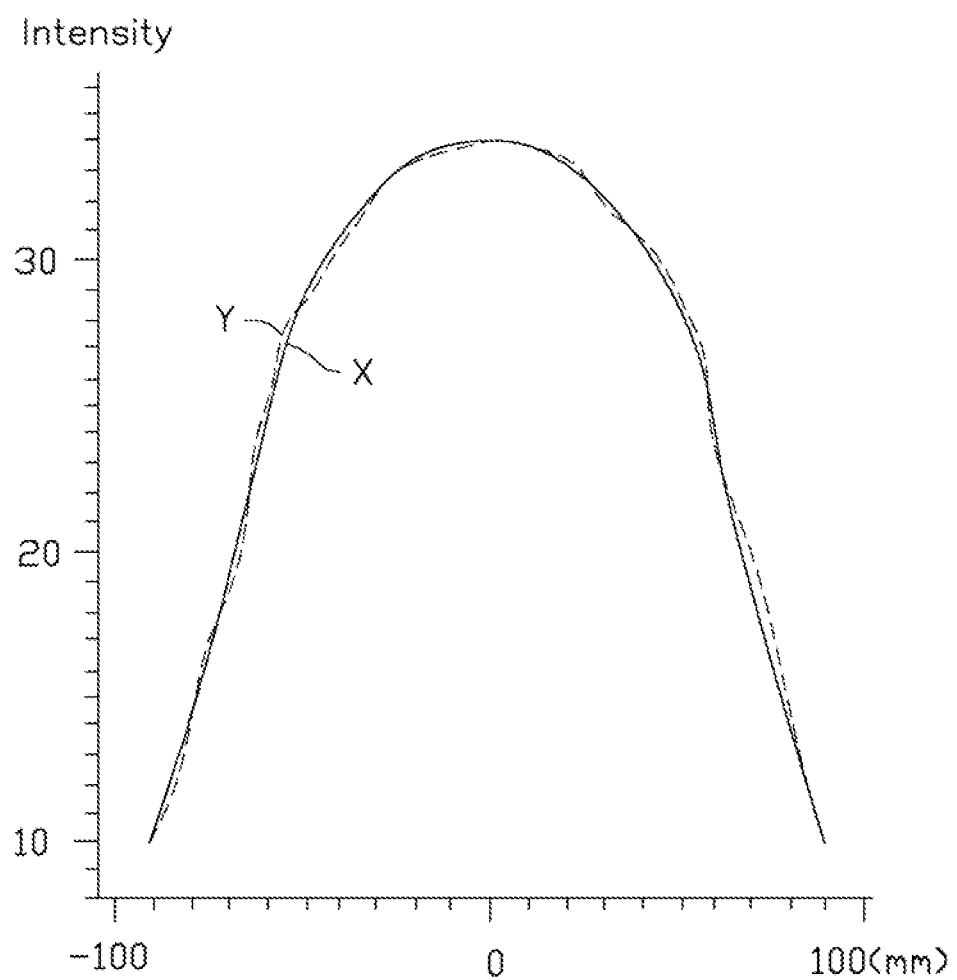
FIG. 5 is a light intensity distribution of the backlight module of FIG. 1

Referring to FIG. 5, a light intensity distribution of the backlight module 1 in accordance with the first embodiment of the present disclosure is illustrated. Different from the lens of the backlight module in FIG. 4, the lens of the backlight module 1 in FIG. 1 includes the main lens 2, the first light-diffusion capping layer 3 and the second light-diffusion capping layer 4 formed on the top of the main lens 2 in sequence.

In the present disclosure, the refractive index of the first light-diffusion capping layer 3 is 1.49, and the refractive index of the second light-diffusion capping layer 4 is 1.24. In other words, a critical angle for total reflection at the main lens-first light-diffusion capping layer interface is 71.63 degrees. That is, the refracted light with an angle smaller than 71.63 degrees but larger than 39.57 degrees is extracted out from the main lens 2 and enters into the first light-diffusion capping layer 3, thereby effectively improving light extraction efficiency of the lens and the backlight module 1 using the lens. Similarly, a critical angle for the total internal reflection at the first light-diffusion capping layer-air interface is 42.16 degrees, and a critical angle for total internal reflection at the first light-diffusion capping layer—the second light-diffusion capping layer interface is 56.33 degrees. That is, the refracted light into the first light-diffusion capping layer 3 with an angle smaller than 56.33 degrees but larger than 42.16 degrees is extracted out from the first light-diffusion capping layer 3 and enters into the second light-diffusion capping layer 4. Accordingly, the light extraction efficiency of the lens and the backlight module 1 using the lens is further improved.

As described above, the lens of the backlight module 1 in FIG. 1 includes the main lens 2, the first light-diffusion capping layer 3 and the second light-diffusion capping layer 4 formed on the top of the main lens 2 in sequence. The refracted light with an incident angle smaller than a critical angle for total internal reflection at the main lens-air interface is mostly extracted from the main lens 2 by the first and second light-diffusion capping layers 3, 4 formed on the top of the main lens 2, thereby creating a uniform light intensity distribution pattern and eliminating the 'hot spot' as shown in FIG. 5.

Figure 6:
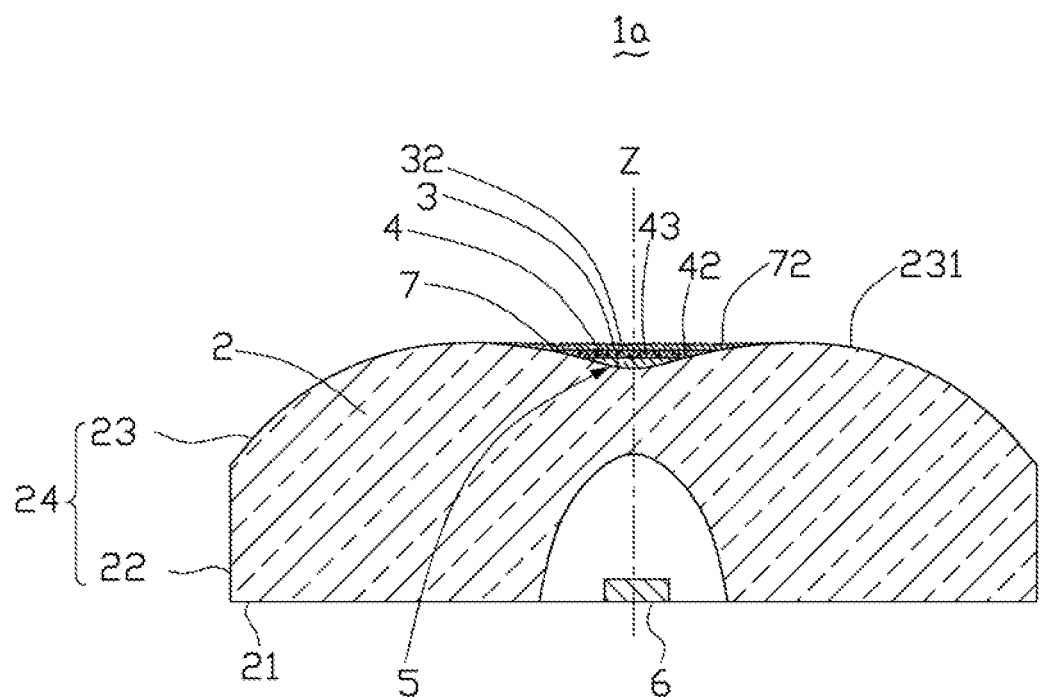
FIG. 6 is a cross-sectional view of a backlight module in accordance with a second embodiment of the present disclosure.

Referring to FIG. 6, a backlight module 1a in accordance with a second embodiment of the present disclosure is illustrated. Different from the backlight module 1 in FIG. 1, the backlight module 1a in FIG. 5 further includes a third light-diffusion capping layer 7 disposed on the second light-diffusion capping layer 4.

The third light-diffusion capping layer 7 is received in the recess 5 and covers the second light-diffusion capping layer 4. A refractive index of the third light-diffusion capping layer 7 is smaller than that of the first and second light-diffusion capping layers 3, 4. The third light-diffusion capping layer 7 includes a top surface 72 and a bottom surface at opposite sides thereof. The bottom surface of the third light-diffusion capping layer 7 engages with the top surface 42 of the second light-diffusion capping layer 4. The top surface 72 of the third light-diffusion capping layer 7 is coplanar with the top of the central region 231 of the second convex portion 23 of the light exit surface 24 of the main lens 2.

In the present embodiment, the top surface 72 of the third light-diffusion capping layer 7 is roughed by ultra violet irradiation or acid etching to form a waved surface. The second light-diffusion capping layer 4 contains phosphor particles 43 therein to transfer a wavelength of the light extracted from the first light-diffusion capping layer 3 into another wavelength. Alternatively, the top surfaces 32, 42 of the first and second light-diffusion capping layers 3, 4 can also be roughed or textured. The first and third light-diffusion capping layers 3, 7 can also contain phosphor particles therein. It is preferred that the first, second and third light-diffusion capping layers 3, 4, 7 contain yellow, green and red phosphor particles therein, respectively.

It is understood that the first, second and third light-diffusion capping layer 3, 4, 7 are sequentially formed in the recess 5 in the present disclosure. Alternatively, the first, second and third light-diffusion capping layer 3, 4, 7 are separately formed, and then are combined together in the recess 5.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A lens for a light emitting diode (LED) backlight module comprising:
   a main lens comprising a light incident surface configured for receiving light emitted from an LED light source and a light exit surface opposite to the light incident surface; and
   a first light-diffusion capping layer and a second light-diffusion capping layer received in the top of the main lens in sequence;
   wherein the main lens defines a recess in the top thereof, and the recess is located at a central region of the light exit surface and recessed inwardly toward the light incident surface of the main lens, the first and the second light-diffusion capping layers being received in the recess with the second light-diffusion capping layer being located over the first light-diffusion capping layer; and
   wherein a refractive index of the first light-diffusion capping layer is smaller that that of the main lens but larger than that of the second light-diffusion capping layer.

2. The lens of claim 1, wherein the main lens has an optical axis extending through the light incident surface and the light exit surface thereof, and a diameter of the recess increases gradually along the optical axis from the light incident surface to the light exit surface of the main lens.

3. The lens of claim 2, wherein the recess is funnel-shaped.

4. The lens of claim 1, wherein the first light-diffusion capping layer directly contacts the main lens defining the bottom of the recess, and the second light-diffusion capping layer covers the first light-diffusion capping layer.

5. The lens of claim 4, wherein the second light-diffusion capping layer comprises a top surface and a bottom surface at opposite sides thereof, and the top surface of the second light-diffusion capping layer is far away from the first light-diffusion capping layer and coplanar with the top of the main lens whereby the lens has a flat top surface at a central region thereof.

6. The lens of claim 1, further comprising a third light-diffusion capping layer received in the recess, wherein the third light-diffusion capping layer covers the second light-diffusion capping layer, and a refractive index of the third light-diffusion capping layer is smaller than that of the second light-diffusion capping layer.

7. The lens of claim 6, wherein the third light-diffusion capping layer comprises a top surface and a bottom surface at opposite sides thereof, and the top surface of the third light-diffusion capping layer is far away from the second light-diffusion capping layer and coplanar with the top of the main lens whereby the lens has a flat top surface at a central region thereof.

8. The lens of claim 7, wherein the top surface of the third light-diffusion capping layer is a rough or textured surface.

9. The lens of claim 8, wherein the top surface of the third light-diffusion capping layer is waved.

10. The lens of claim 6, wherein at least one of the first, second and third light-diffusion capping layers contains phosphor particles therein.

11. The lens of claim 1, wherein the main lens further comprises an annular mounting surface interconnecting the light incident surface and the light exit surface thereof, and the light incident surface is located at a center of the mounting surface and recessed inwardly towards the light exit surface from an inner periphery of the annular mounting surface.

12. The lens of claim 11, wherein the light exit surface comprises a first cylindrical portion extending upwardly from an outer periphery of the annular mounting surface and a second convex portion bending inwardly and upwardly from a top periphery of the first cylindrical portion.

13. The lens of claim 12, wherein the recess is located at a central region of the second convex portion.

14. A backlight module comprising:
   a light emitting diode (LED) light source; and
   a lens optically coupled to the LED light source, comprising a main lens, a first light-diffusion capping layer and a second light-diffusion capping layer formed on the top of the main lens in sequence, the main lens comprising a light incident surface for receiving light from the LED light source and a light exit surface opposite to the light incident surface, the light generated by the LED light source leaving the main lens from the light exit surface;
   wherein the main lens defines a recess in the top thereof, and the recess is located at a central region of the light exit surface and recessed inwardly toward the light incident surface of the main lens, the first and the second light-diffusion capping layers being received in the recess; and
   wherein the second light-diffusion capping layer is located over the first light-diffusion capping layer, and a refractive index of the first light-diffusion capping layer is smaller that that of the main lens but larger than that of the second light-diffusion capping layer.

15. The backlight module of claim 14, wherein the main lens has an optical axis extending through the light incident surface and the light exit surface thereof, and a width of the recess increases gradually along the optical axis from the light incident surface to the light exit surface of the main lens.

16. The backlight module of claim 15, wherein the recess is funnel-shaped.

17. The backlight module of claim 14, wherein the second light-diffusion capping layer covers the first light-diffusion capping layer, and the second light-diffusion capping layer comprises a top surface and a bottom surface at opposite sides thereof, the top surface of the second light-diffusion capping layer being far away from the first light-diffusion capping layer and coplanar with the top of the main lens whereby the lens has a flat top surface at a central region thereof.

18. The backlight module of claim 14, further comprising a third light-diffusion capping layer received in the recess, wherein the third light-diffusion capping layer covers the second light-diffusion capping layer, and a refractive index of the third light-diffusion capping layer is smaller than that of the second light-diffusion capping layer.

19. The backlight module of claim 14, wherein the main lens further comprises an annular mounting surface interconnecting the light incident surface and the light exit surface thereof, and the light incident surface is located at a center of the mounting surface and recessed inwardly towards the light exit surface from an inner periphery of the annular mounting surface.

20. The backlight module of claim 19, wherein the light exit surface comprises a first cylindrical portion extending upwardly from an outer periphery of the annular mounting surface and a second convex portion bending inwardly and upwardly from a top periphery of the first cylindrical portion, and the recess is located at a central region of the second convex portion of the light exit surface.

* * * * *